United States Patent [19]

Buschor

[11] Patent Number: 4,555,216
[45] Date of Patent: Nov. 26, 1985

[54] WORKPIECE HOLDING AND POSITIONING MECHANISM AND SYSTEM

[75] Inventor: Josef J. Buschor, San Jose, Calif.

[73] Assignee: Five X Corporation, Santa Clara, Calif.

[21] Appl. No.: 553,534

[22] Filed: Nov. 21, 1983

[51] Int. Cl.[4] .............................................. B66C 23/18
[52] U.S. Cl. .................................. 414/728; 294/116; 414/8; 414/735
[58] Field of Search .................... 414/735, 8, 749, 753, 414/739, 728; 901/16, 36–39; 294/115, 116; 340/626; 15/339

[56] References Cited

U.S. PATENT DOCUMENTS

| | | | |
|---|---|---|---|
| 3,408,101 | 10/1968 | Savary | 294/116 |
| 3,606,162 | 9/1971 | Lehmann | 901/16 X |
| 3,665,148 | 5/1972 | Yasenchak et al. | 901/16 X |
| 3,915,314 | 10/1975 | Anikanov et al. | 414/749 |
| 4,049,935 | 9/1977 | Gruber | 340/626 X |
| 4,093,296 | 6/1978 | Itoh | 294/115 X |

FOREIGN PATENT DOCUMENTS 772841 10/1980 U.S.S.R. .................................. 414/8

Primary Examiner—Leslie J. Paperner
Assistant Examiner—Donald W. Underwood
Attorney, Agent, or Firm—Edward B. Gregg; Willis E. Higgins

[57] ABSTRACT

A workpiece positioning mechanism (10, FIG. 1) includes a movable arm (12) having a plurality of joints (14). A pair of grippers (26 and 28) are movable toward and away from a semiconductor-wafer boat (44). The grippers are held in position by a stop member (70, FIG. 4) when they engage the boat (44) and locked in an open position by prongs (86). A solenoid (30) is actuated to allow the grippers to move between their open and closed positions. Flexible bellows (22 and 94) and tubing (24) surround moving parts (e.g., 14, 62, 64, 66, 80) of the mechanism (10) to prevent contamination of the semiconductor wafers (52).

13 Claims, 8 Drawing Figures

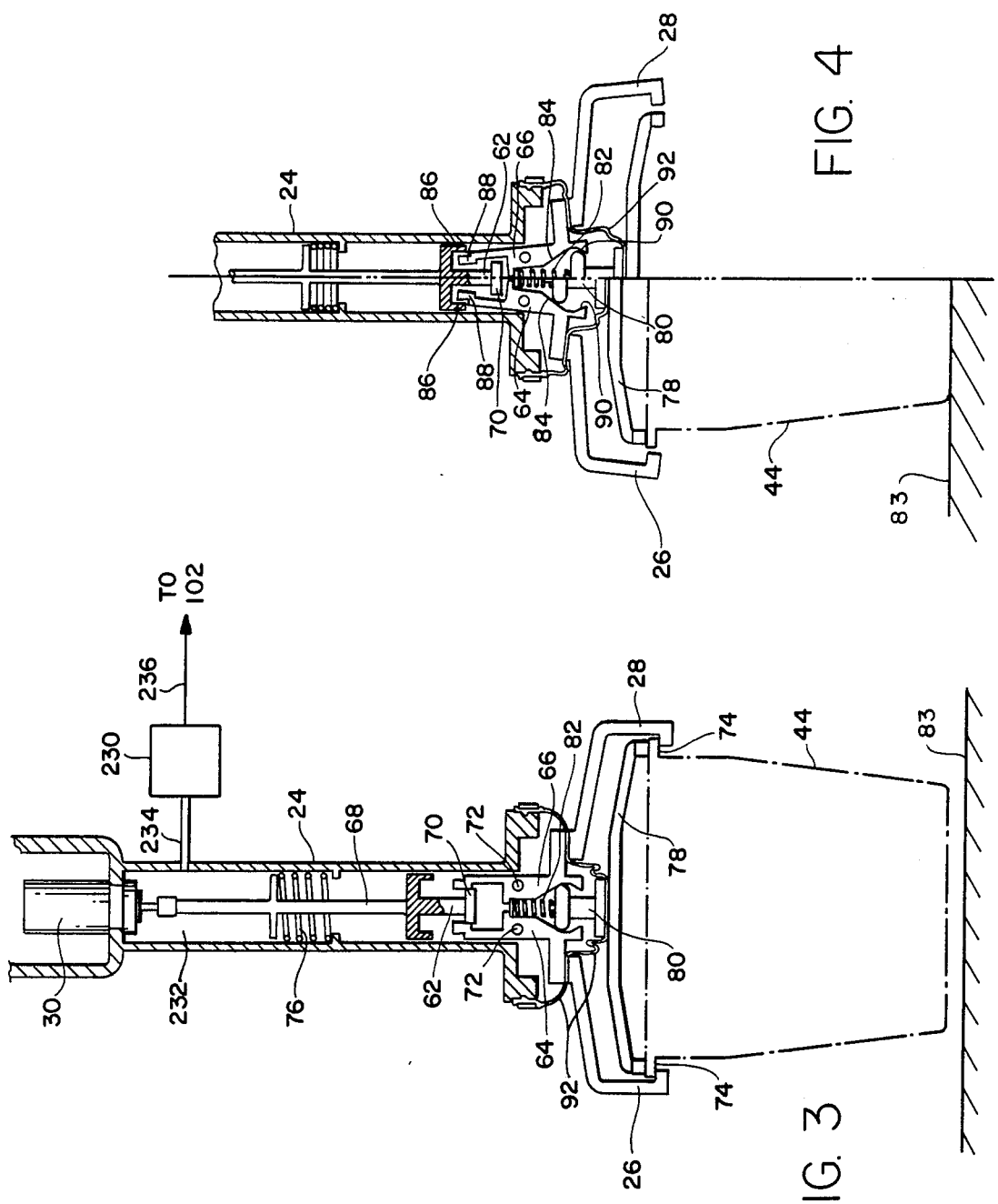

WORKPIECE HOLDING AND POSITIONING MECHANISM AND SYSTEM

BACKGROUND OF THE INVENTION

1. Field of the Invention

This invention relates to a mechanism for grasping and releasing workpieces in a manner that prevents accidental damage to the workpieces. It further relates to a mechanism and system for moving workpieces from one location to another during manufacturing. It further relates to such a mechanism and system which are especially adapted for use in moving semiconductor wafers and similar articles which are prone to damage by contamination and which have a relatively high value before manufacturing is completed.

2. Description of the Prior Art

The manufacture of integrated circuits takes place in Class 100 clean environments, either in entire rooms which meet such standards of clean air or in laminar flow hoods which meet such standards. Semiconductor wafers in which the integrated circuits are being fabricated are conventionally loaded into quartz, metal or plastic wafer boats, depending on the process step being performed, and manually moved from one work station to another. However, in such clean environments, human beings are a significant source of contamination. In an effort to reduce human contact with the semiconductor wafers during the fabrication process, it is known to provide laminar flow hoods with closed fronts incorporating flexible gloves into which operators insert their hands to move wafer boats within the laminar flow hoods. However, the use of such flexible glove closed fronts makes the movement of wafer boats filled with semiconductor wafers within the hood a clumsy operation at best.

Another approach that has been incorporated in some integrated circuit manufacturing operations has been to eliminate the use of wafer boats in favor of air slides or similar apparatus for moving the semiconductor wafers from place to place. However, that approach tends to lack flexibility for incorporating different equipment in the manufacturing line. It therefore finds favor only in situations where a very large volume of standard parts is to be fabricated over a substantial period of time. However, the manufacture of integrated circuits is a dynamic business, in which constant change is the norm. There is therefore a further need to improve apparatus for handling semiconductor wafers and similar articles which are prone to damage from contamination. Any mechanisms used for this purpose must themselves not be a source of significant contamination to the environment in which the integrated circuit manufacturing takes place, and it must be capable of picking up wafer boats at one location, moving them to another location, and releasing them, all in a very reliable manner without damaging the valuable product being manipulated.

SUMMARY OF THE INVENTION

Accordingly, it is an object of the invention to provide a mechanism for holding a workpiece with improved safeguards for preventing the mechanism from dropping the workpiece.

It is another object of the invention to provide such a workpiece holding mechanism incorporating an improved mechanism for gripping the workpiece and for releasing the workpiece with locking means for preventing damage to the workpiece during the gripping and release operations.

It is a further object of the invention to provide an improved workpiece positioning mechanism useful for moving a wafer boat containing semiconductor wafers from one location to another during the manufacture of semiconductor devices.

It is still another object of the invention to provide a workpiece positioning mechanism useful for handling semiconductor wafers and other articles prone to damage by contamination, which mechanism is constructed to prevent moving parts of the mechanism from contaminating the semiconductor wafers or other articles prone to damage by contamination.

It is a further object of the invention to provide such a workpiece positioning mechanism which warns of an equipment failure that might result in product contamination.

It is yet another object of the invention to provide such a workpiece holding mechanism which requires actuation power only during a small proportion of its total operating time.

It is a still further object of the invention to provide such a workpiece holding mechanism in which a workpiece must be supported on a solid surface for loading or unloading from the mechanism.

It is still another object of the invention to provide a system incorporating such a workpiece holding and positioning mechanism.

It is still a further object of the invention to provide such a system in which the workpieces are transferred among a plurality of such mechanisms during processing of the workpieces.

The attainment of these and related objects may be achieved with the novel workpiece holding and positioning mechanism herein disclosed. A workpiece holding mechanism in accordance with this invention includes a pair of opposing grippers movable from an open position laterally to a closed position engaging the workpiece. A locking means is movable between a first position to lock the grippers in the closed position and a second position to lock the grippers in the open position. An actuating means moves the locking means between the first position and the second position. A biasing means in opposition to the actuating means urges the locking means toward the first position. A means responsive to upward force imparted by the workpiece engaged by the grippers moves the grippers to the open position.

A workpiece positioning mechanism in accordance with the invention includes such a workpiece holder and an arm having a plurality of joints for moving the workpiece holder. The joints preferably include a flexible bellows surrounding each of the joints, so that grease or metal particles from the joints do not contaminate semiconductor wafers or other workpieces prone to damage by contamination when they are being moved. The workpiece positioning mechanism also may include a movable base carrying the holding mechanism and the arm. A lead screw is connected to move the movable base. Contamination from the lead screw is also prevented by providing a flexible bellows surrounding the lead screw. The flexible bellows desirably form part of at least one sealed chamber around the joints, lead screw, and/or other moving parts of the mechanism. A pressure different than atmospheric is maintained in the sealed chamber. A pressure sensing and indicating means detects a change in the pressure different than atmospheric and thus signals any leaks in the sealed chamber.

The attainment of the foregoing and related objects, advantages and features of the invention should be more readily apparent to those skilled in the art, after review of the following more detailed description of the invention, taken together with the drawings, in which:

BRIEF DESCRIPTION OF THE DRAWINGS

FIG. 3 is a cross section view of the workpiece holding mechanism shown in FIG. 2.

FIG. 4 is another cross section view of a portion of the workpiece holding mechanism in FIG. 3, but in another operating position.

DETAILED DESCRIPTION OF THE INVENTION

Figure 1:
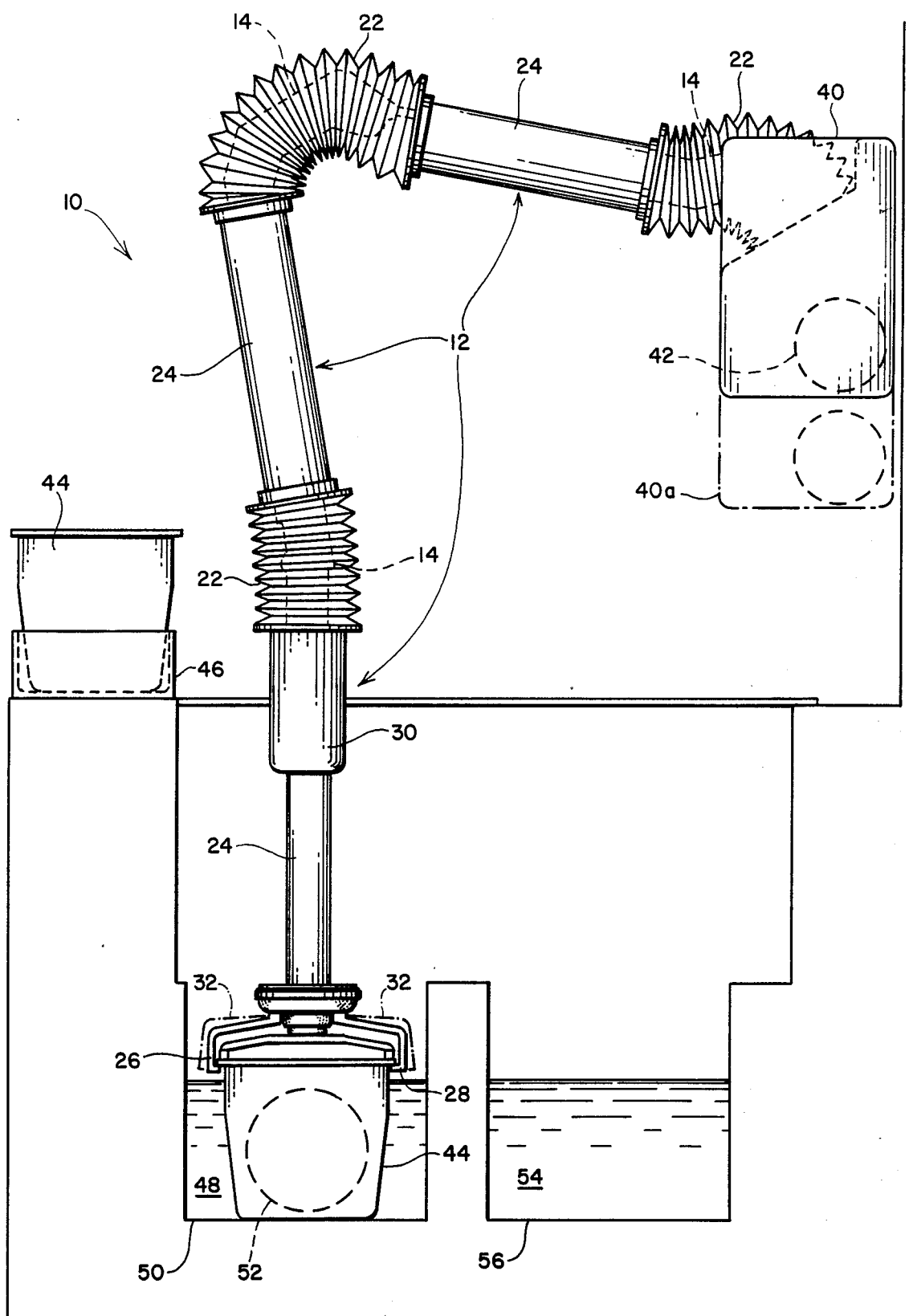
FIG. 1 is a side view of a workpiece positioning mechanism in accordance with the invention, incorporating a workpiece holding mechanism in accordance with the invention.
Figure 5:
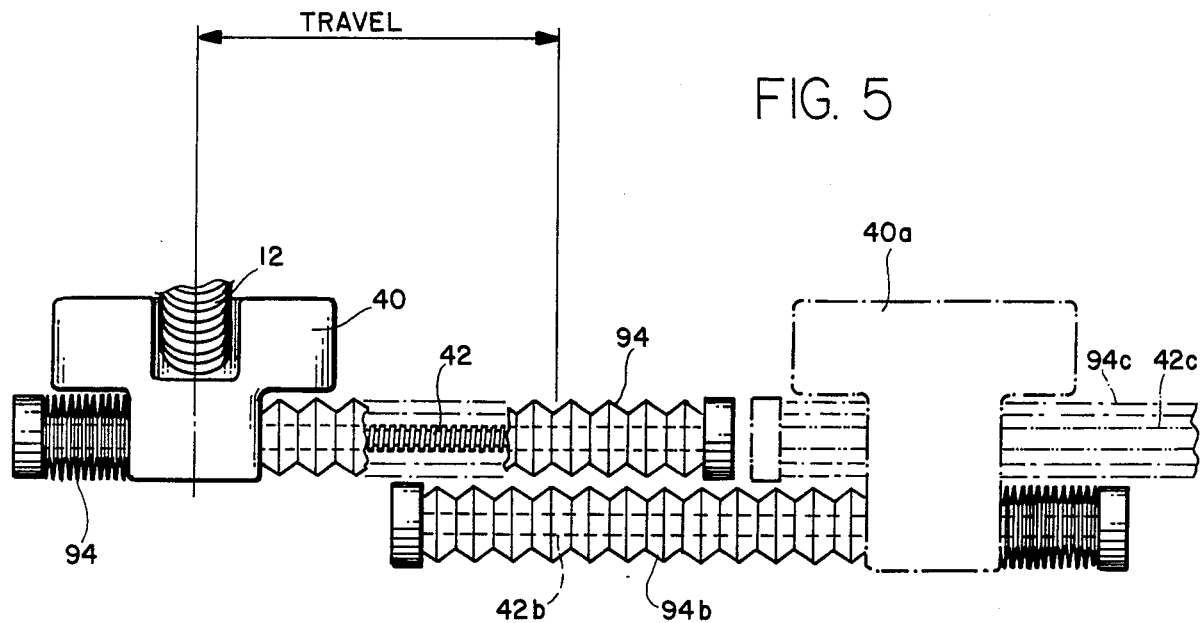
FIG. 5 is a front view showing a portion of the workpiece positioning mechanism of FIG. 1.

Turning now to the drawings, more particularly to FIG. 1, there is shown a workpiece positioning mechanism 10 in accordance with the invention. The mechanism 10 includes an arm 12, having a plurality of movable joints 14. A rubber, plastic or similar flexible bellows 22 surrounds each of the joints 14. The bellows 22 are connected to polypropylene tubing 24, to form a sealed chamber around the moving parts of the arm 12. A pair of grippers 26 and 28 are attached to the arm 12. A solenoid 30 allows the grippers to move between the closed position shown and open position 32 indicated in dotted line when actuated. The arm 12 is connected to a base 40, which is movable by means of lead screw 42 in a direction perpendicular to the plane of FIG. 1. Further details of the base 40 and lead screw 42 are shown in FIG. 5.

In use, the positioning mechanism 10 grasps a wafer boat 44 in transfer station 46 and inserts it in a processing solution 48 in tank 50 for carrying out etching or other process operations on a plurality of semiconductor wafers 52 contained in the wafer boat 44. The wafer boat 44 is then released by the grippers 26 and 28 during processing, to allow the mechanism 10 to position another wafer boat 44. When the processing of wafers 52 in bath 48 has been completed, arm 12 is moved to the position shown for moving the wafer boat 44 from tank 50 to a second processing solution 54, for example, a rinse solution, in a second tank 56. At the conclusion of processing in tank 56, the wafer boat 44 may be returned by the mechanism 10 to transfer station 46 for further operations.

The mechanism 10 can also be used to agitate the wafers 52, by oscillating them up and down and/or horizontally. Such motion when the wafers are in a bath 48 or 54 will improve the action of the bath solution.

Figure 2:
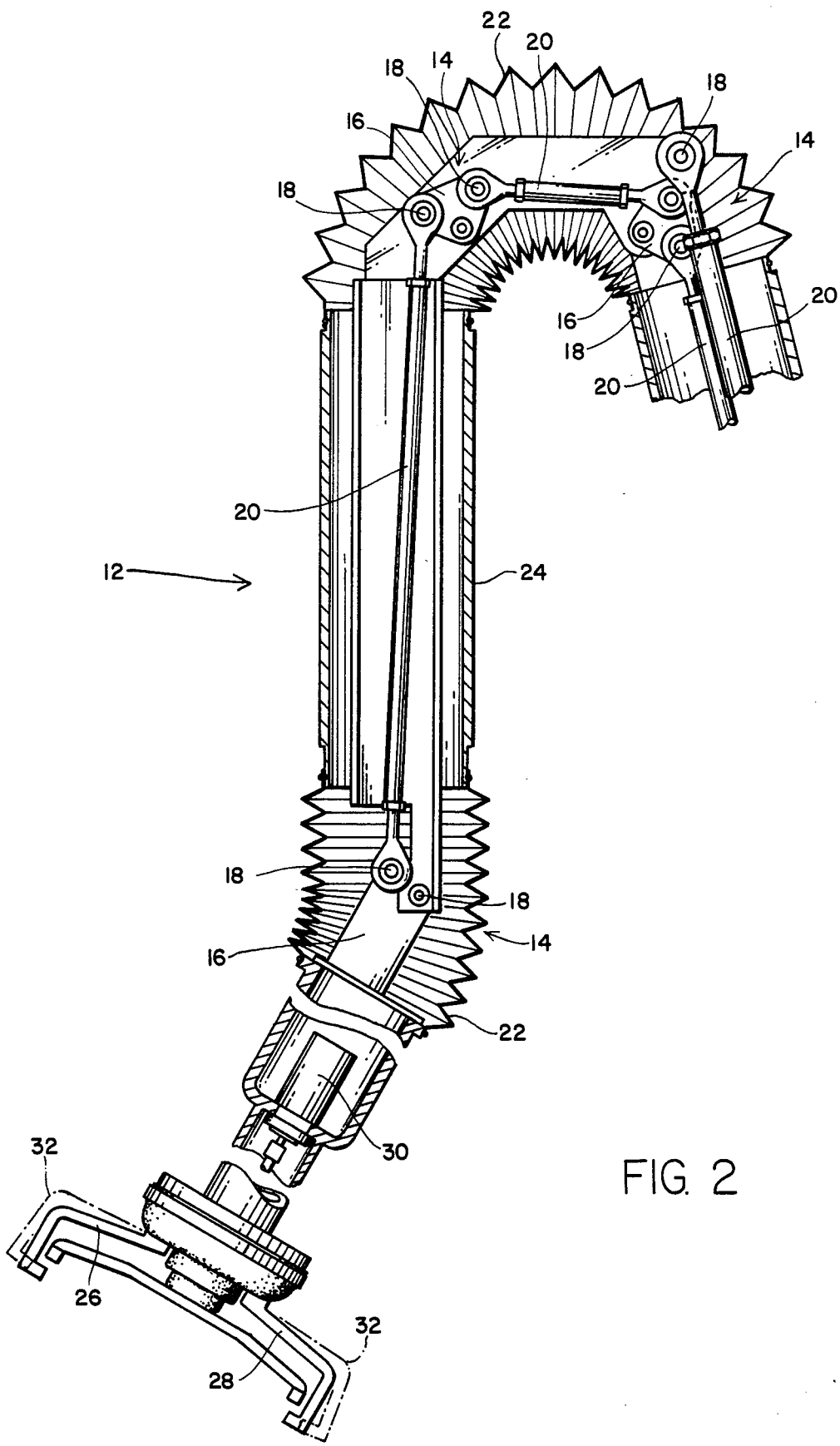
FIG. 2 is an elevation view of a portion of the workpiece positioning mechanism and the workpiece holding mechanism shown in FIG. 1.

Details of the interior mechanism of the arm 12 are shown in FIG. 2. Within the bellows 22 and tubing 24, each of the joints 14 include pivot plates 16 and pivots 18. Rods 20 extend between the joints 14. Through application of suitable actuating forces to the rods 20, arm is moved to position the wafer boat 44 as desired during the operation of the mechanism 10.

Further details of the grippers 26 and 28 and their actuating mechanism are shown in FIGS. 3 and 4. Solenoid 30 is connected to a movable stop 62 positioned between pivotable lever members 64 and 66 by rod 68 within tubing 24. When the stop 62 is in its upper position as shown in FIG. 3 (solenoid 30 is off), portion 70 of stop prevents the pivotable lever members 64 and 66 from pivoting toward one another above pivots 72, thus locking the grippers 26 and 28 in their closed position gripping wafer boat 44 by a lip 74 extending around its top. Spring 76 biases rod 68 upwards in opposition to the solenoid 30, to the position shown in FIG. 3.

Member 78 rests on top of lip 74 of the wafer boat 44 when the wafer boat 44 is grasped by grippers 26 and 28. A camming member 80 is supported on the member 78. A spring 82 is connected between lever members 64 and 66 to bias the camming member 80 downward. With the camming member 80 in the position shown in FIG. 3, lever member 64 and 66 are free to assume the position shown in FIG. 3, thus closing the grippers 26 and 28 to hold the wafer boat 44.

FIG. 4 shows how the grippers 26 and 28 are moved to their open position. When the wafer boat 44 is rested on a supporting surface 83, an upward force is exerted on the member 78 by the wafer boat 44. Solenoid 30 is actuated to lower the stop member 62, so that the pivotable lever members 64 and 66 may pivot their upper ends toward one another. Camming member 80 pushes against surfaces 84 to produce the pivoting action, moving grippers 26 and 28 away from wafer boat 44 to the open position shown. This allows upper ends 86 of the stop member 62 to clear the ends 88 of lever members 64 and 66 to engage them from their sides, so that the grippers 26 and 28 are locked in their open position as shown. Arm 12 (FIG. 1) may now be raised to move the grippers 26 and 28 away from the wafer boat 44. The grippers 26 and 28 may also be opened with no wafer boat in place by actuating solenoid 30 to move stop 62 downward to move portion 70 of stop 62. In the absence of wafer boat 44, spring 82 biases camming member 80 against surfaces 90 of lever members 64 and 66 to produce the pivoting action for moving grippers 26 and 28 to the open position. When the lever members 64 and 66 have pivoted to the position shown in FIG. 4, with continued actuation of solenoid 30, ends 86 of the stop member 62 will clear ends 88 of the lever members 64 and 66 to engage them from their sides. Should power to the solenoid 30 be lost in this case, grippers 26 and 28 remain in the open position, due to the action of camming member 80 and spring 82 on surfaces 90. In order for grippers 26 and 28 to be closed, solenoid 30 must be turned off and a wafer boat 44 must be in position to push camming member 80 away from surfaces 90. The weight of grippers 26 and 28 then pivots members 64 and 66 to the position shown in FIG. 3. Rubber or other flexible material diaphragm 92 is fastened to tubing 24 to form a sealed chamber for preventing the actuating mechanism of FIGS. 3 and 4 from contaminating the wafers 52 in wafer boat 44.

FIG. 5 shows the base 40 to which arm 12 is attached. The base 40 is movable to the left and right by means of the lead screw 42 attached to the base 40. A flexible bellows 94 surrounds the lead screw 42 to prevent contamination of wafers 52 in the wafer boat 44 (FIG. 1) from the lead screw 42. Bellows 94 flexes as the base 40 moves laterally. Also shown is a second, different shaped base 40a, a second lead screw 42b and bellows 94b. The lead screw 42b and bellows 94b overlaps the first lead screw 42 and bellows 94, so that the path of travel of base 40a may overlap the path of travel of base 40. This allows transfer of a wafer boat 44 between mechanisms 10 located side by side. Also shown is a portion of a third lead screw 42c and bellows 94c, connected to a base (not shown) having the same shape as base 40. Such an alternating arrangement of bases 40 and 40a allows a substantial number of the mechanisms 10 to be positioned side by side in a semiconductor wet processing line for carrying out sequential wet processing operations on wafers 52 in wafer boats 44 as they are passed along the line from mechanism 10 to mechanism 10.

Figure 6:
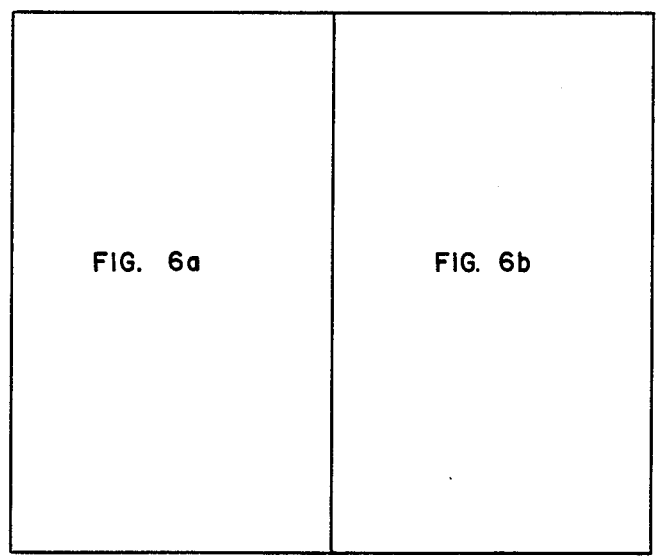
FIG. 6 is a key showing placement of FIGS. 6a and 6b.
Figure 6A:
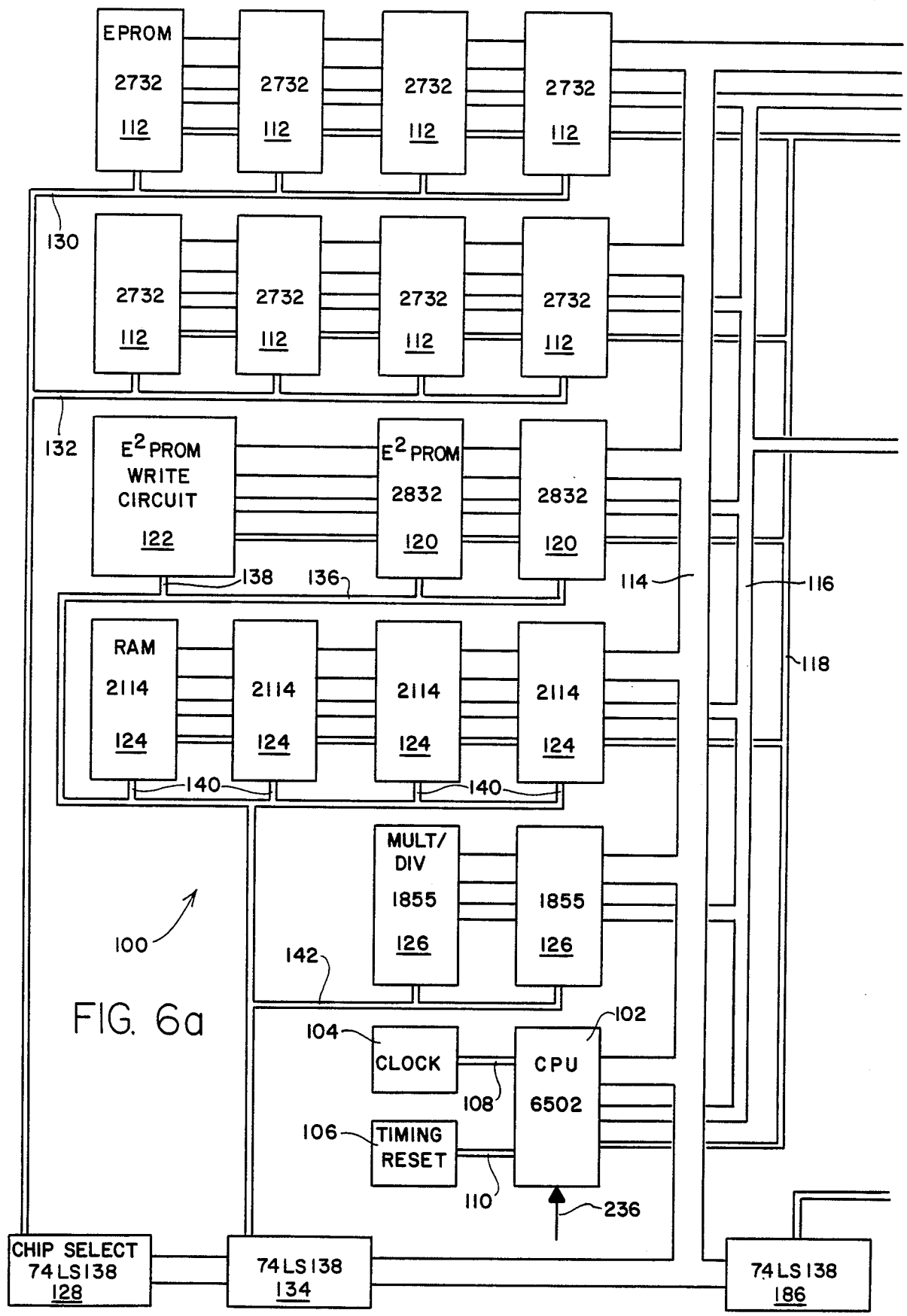
FIGS. 6a and 6b are a block diagram of a control system for the workpiece holding and positioning mechanism shown in FIGS. 1-5.
Figure 6B:
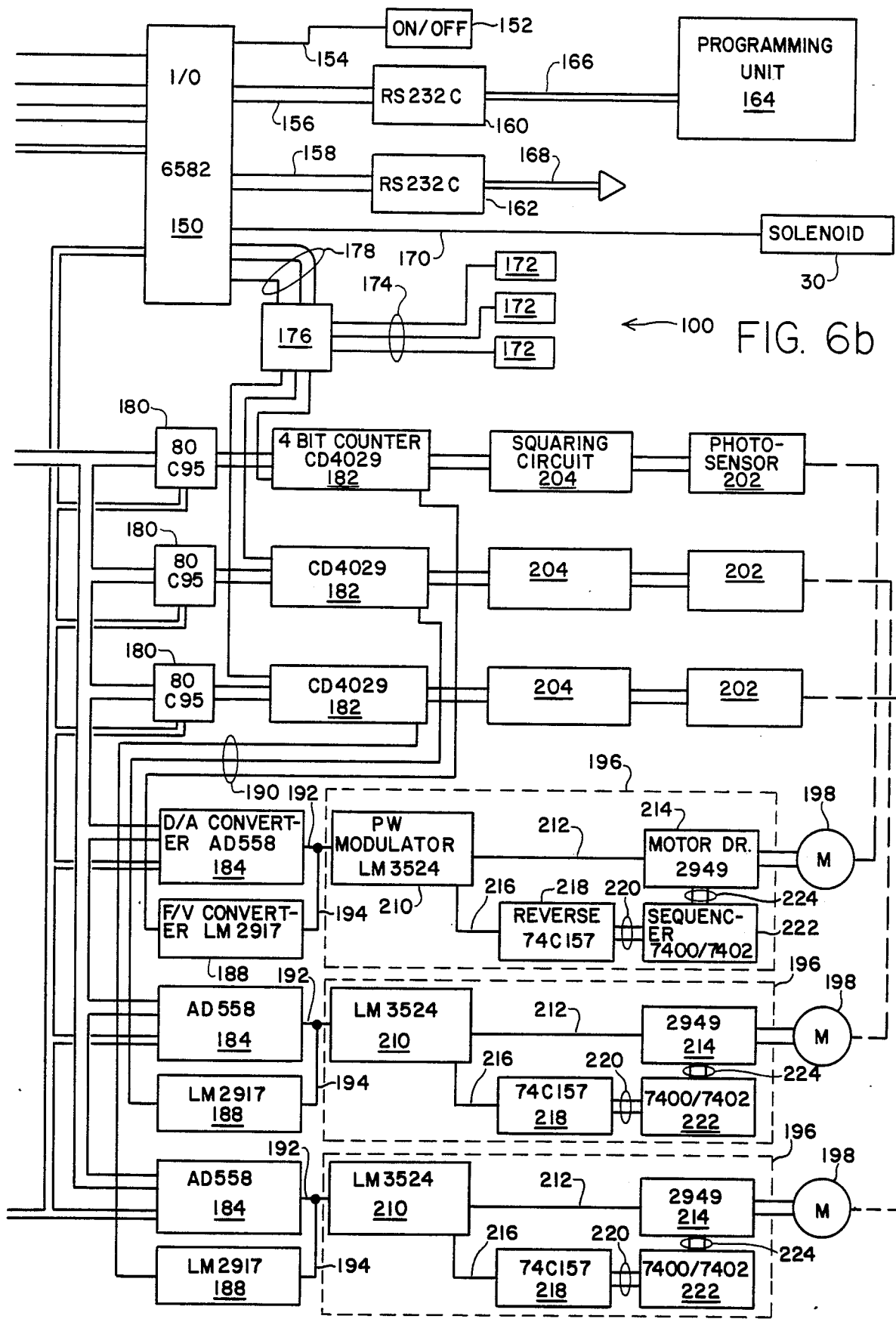

FIGS. 6a and 6b, which may be placed together as shown in FIG. 6, show a control system 100 for the workpiece gripping and positioning mechanism 10 shown in FIGS. 1-5. A 6502 type microprocessor integrated circuit 102 serves as the central processing unit (CPU) of the system. A clock circuit 104 and a timing reset circuit 106 are connected to the CPU 102 by lines 108 and 110, respectively. The CPU 102 is connected to 2732 type electrically programmable read only memory (EPROM) circuits 112 by an address bus 114, a data bus 116, and a control bus 118. The busses 114, 116, and 118 also connect the CPU 102 to 2832 type electrically erasable programmable read only memory ($E^2$PROM) circuits 120 and $E^2$PROM write circuit 122. Random access memory (RAM) circuits 124 of the 2114 type are also connected to the CPU 102 by busses 114, 116, and 118. Two 1855 type multiply and divide circuits 126 are connected to the CPU 102 by busses 114 and 116. A 74LS138 type chip select circuit 128 is connected to the EPROM circuits 112 by lines 130 and 132. A second chip select circuit 134 is connected to the $E^2$PROM circuits 120, the $E^2$PROM write circuit 122, the RAM circuits 124 and the multiply and divide circuits 126 by lines 136, 138, 140 and 142, respectively. The chip select circuits 128 and 134 are also connected to the CPU 102 by bus 114.

Busses 114, 116 and 118 also connect the CPU 102 to a 6582 type input/output (I/O) circuit 150. The I/O circuit 150 is connected to a start and emergency off switch 152 by line 154. Busses 156 and 158 connect the I/O circuit 150 to RS232C type ports 160 and 162. The RS232C port 160 is connected to a programming unit 164 by bus 166. The port 162 is connected to an external data processing system (not shown) by bus 168. Solenoid 30 is connected to the I/O circuit 150 by line 170. Null sensors 172 are connected by lines 174, interface circuit 176 and lines 178 to the I/O circuit 150.

Data bus 116 also connects the CPU 102 through 80C95 type buffer circuits 180 to CD4029 type 4 bit counter circuits 182. Data bus 116 is also connected to AD558 type digital/analog (D/A) circuits 184. A third chip select circuit 186 is connected between the address bus 114 and the I/O circuit 150, the buffer circuits 180, and the A/D converter circuits 184. The 4 bit counter circuits 182 are connected to LM2917 type frequency to voltage (F/V) converter circuits 188 by lines 190. The D/A converters 184 and the F/V converts 188 are connected by lines 192 and 194 to servo and sequencer circuits 196. The servo and sequencer circuits 196 are connected to motors 198, which move the arm 12 and the base 40 (see also FIGS. 1 and 5). The motors 198 are connected in a feedback loop through photosensors 202 and squaring circuits 204 to the counter circuits 182.

The servo and sequencer circuits 196 include LM3524 type pulse width modulator circuits 210, each connected to receive outputs from one of the converter circuits 184 and 188 on lines 192. Control outputs are supplied by the pulse width modulator circuits 210 on lines 212 to 2949 type motor drive circuits 214. Reverse control outputs are supplied by the pulse width modulator circuits 210 on lines 216 through 74C157 type multiplexer circuits 218, line 220, 7400/7402 type nand/nor gate circuits 222 and lines 224, to the motor drive circuits 214.

The flexible bellows 22 and tubing 24, flexible diaphragm 92 (FIGS. 1 and 3), flexible bellows 94, 94b and 94c (FIG. 5) complete one or more sealed enclosures for the moving parts of the workpiece positioning mechanism. Such sealed chambers prevent particulate or other contamination of the wafers 52 from the moving parts. A pressure different than atmospheric is maintained in the sealed chambers. This pressure may either be less than atmospheric, i.e., a partial vacuum, or it may be greater than atmospheric, such as nitrogen or other inert gas under pressure. As shown in FIG. 3, a pressure sensor 230 may be connected to the sealed chamber 232 by a sensing port 234. Pressure sensor 230 detects changes in the vacuum or pressurized gas level in chamber 232. Such pressure changes are an indication of a leak in chamber 232. Pressure sensor 230 provides an interrupt input to microprocessor 102 (FIG. 6A) on line 236 for initiating a routine to indicate detection of a pressure change in chamber 232.

Suitable software is provided for the control system 100 to operate the mechanism 10 in the manner described above. Such programs incorporate inputs from null sensors 172, photosensor devices 202, pressure sensor 230 and other sensors as necessary to central operation of the mechanism 10 for carrying out the various motions of the mechanism during operation.

It should now be apparent to those skilled in the art that a workpiece holding and positioning mechanism capable of achieving the stated objects of the invention has been provided. Because the grippers of the holding mechanism are positively locked in both their open and closed positions, the holding mechanism grasps and releases wafer boats containing semiconductor wafers and other valuable workpieces in a highly reliable manner. Power need be applied to operate the holding mechanism only during the brief interval of loading and unloading the workpiece from the mechanism. A workpiece to be grasped or released by the mechanism must be supported on a solid surface to allow loading or unloading to or from the mechanism. The positioning mechanism incorporating the holding mechanism is constructed in a manner that avoids contamination of semiconductor wafers and other workpieces prone to damage by contamination. The control system and mechanism of this invention are therefore capable of meeting the rigorous demands of such manufacturing environments as integrated circuit fabrication.

It should further be apparent to those skilled in the art that various changes in form and details of the invention as shown and described may be made. It is intended that such changes be included within the spirit and scope of the claims appended hereto.

What is claimed is:

1. A workpiece holding mechanism, which comprises a pair of opposing grippers movable from an open position laterally to a closed position for engaging the workpiece, locking means movable between a first position to lock said grippers in the closed position and a second position to lock said grippers in the open position, actuating means for moving said locking means between the first position and the second position, said actuating means including a solenoid actuated rod, first and second pivotable and opposed lever members each being attached to one of said pair of grippers to move said grippers between the open and closed positions, said locking means being attached to said rod, and said locking means including a first portion dimensioned and configured to fit between said first and second pivotable lever members and a second portion dimensioned and configured to fit on either side of said pivotable lever members to lock said grippers in the open and closed positions, biasing means in opposition to said actuating means and urging said locking means toward the first position, and means responsive to upward force imparted by the workpiece engaged by said grippers for moving said grippers to the open position, said upward force responsive means also holding said grippers in the open position in absence of the workpiece in said grippers.

2. A workpiece positioning mechanism comprising the workpiece holder of claim 1 and an arm having a plurality of joints for moving the workpiece holder.

3. The workpiece positioning mechanism of claim 2 in which the joints of said arm include a flexible bellows surrounding each of said plurality of joints.

4. The workpiece positioning mechanism of claim 3 in which said arm and flexible bellows form at least one sealed chamber around said plurality of joints having a pressure different than atmospheric, said mechanism additionally comprising means for sensing and indicating a change in the pressure different than atmospheric.

5. The workpiece positioning mechanism of claim 4 in which the pressure different than atmospheric is a pressure less than atmospheric.

6. The workpiece positioning mechanism of claim 5 in which the pressure different than atmospheric is a pressure greater than atmospheric and is formed by an inert gas.

7. A workpiece positioning mechanism, comprising the workpiece holding mechanism of claim 1 in combination with a movable base, a lead screw connected to move said movable base, and at least one flexible bellows surrounding said lead screw.

8. The workpiece positioning mechanism of claim 7 in which said flexible bellows forms part of at least one sealed chamber around said lead screw having a pressure different than atmospheric, said mechanism additionally comprising means for sensing and indicating a change in the pressure different than atmospheric.

9. The workpiece positioning mechanism of claim 7 additionally comprising a movable arm mounted on said movable base and having a plurality of joints, at least one additional flexible bellows surrounding each of said plurality of joints, and means connected to move said movable arm and said movable base.

10. The workpiece positioning mechanism of claim 9 in which said at least one additional flexible bellows forms part of at least one sealed chamber surrounding each of said plurality of joints, having a pressure different than atmospheric.

11. The workpiece positioning mechanism of claim 10 in which the pressure different than atmospheric is less than atmospheric.

12. The workpiece positioning mechanism of claim 10 in which the pressure different than atmospheric is greater than atmospheric and is formed by an inert gas.

13. A workpiece positioning system comprising a plurality of workpiece positioning mechanisms in accordance with claim 9, said lead screws of adjacent workpiece positioning mechanisms being positioned to provide an overlapping path of travel between said movable bases of the adjacent workpiece positioning mechanism so that the workpieces may be passed between the adjacent workpiece positioning mechanisms.

* * * * *